US012750012B2

(12) United States Patent
Gu

(10) Patent No.: US 12,750,012 B2
(45) Date of Patent: Sep. 29, 2026

(54) FULLY INTEGRATED CMOS MULTIPLE MOSFET-STACKED DOUBLE PUSH-PULL RF POWER AMPLIFIER

(71) Applicant: Shanghai WUQI Microelectronics Co., Ltd., Shanghai (CN)

(72) Inventor: Qiang Gu, Shanghai (CN)

(73) Assignee: Shanghai WUQI Microelectronics Co., Ltd., Shanghai (CN)

( * ) Notice: Subject to any disclaimer, the term of this patent is extended or adjusted under 35 U.S.C. 154(b) by 739 days.

(21) Appl. No.: 18/109,877

(22) Filed: Feb. 15, 2023

(65) Prior Publication Data

US 2024/0136982 A1 Apr. 25, 2024
US 2024/0235492 A9 Jul. 11, 2024

(30) Foreign Application Priority Data

Oct. 25, 2022 (CN) ......................... 202211312865.2

(51) Int. Cl.

| | |
|---|---|
| ***H03F 3/45*** | (2006.01) |
| ***H03F 1/32*** | (2006.01) |
| ***H03F 1/56*** | (2006.01) |
| ***H03F 3/30*** | (2006.01) |

(52) U.S. Cl.

CPC ........... *H03F 1/3217* (2013.01); *H03F 1/565* (2013.01); *H03F 3/3033* (2013.01); *H03F 3/3038* (2013.01); *H03F 2200/222* (2013.01); *H03F 2200/451* (2013.01); *H03F 2203/21142* (2013.01)

(58) Field of Classification Search

CPC ...... H03F 1/3217; H03F 1/565; H03F 3/3033; H03F 3/3038; H03F 2200/222; H03F 2200/451; H03F 2203/21142; H03F 2203/45301; H03F 2203/45731; H03F 1/223; H03F 3/19; H03F 3/45188; H03F 3/45242; H03F 3/245; H03F 3/193; H03F 1/0211; H03F 1/3205; H03F 1/3211; H03F 3/21; H03F 3/45183; H03F 2203/45031

USPC ......................................... 330/269, 253, 254

See application file for complete search history.

(56) References Cited

U.S. PATENT DOCUMENTS 10,110,177 B1 * 10/2018 Koroglu .................... H03F 3/21
2021/0126587 A1 * 4/2021 Panseri ................... H03F 3/245

* cited by examiner

*Primary Examiner* — Jessica Han
*Assistant Examiner* — Khiem D Nguyen
(74) *Attorney, Agent, or Firm* — IPRTOP LLC

(57) ABSTRACT

An amplification circuit for RF power amplifiers is provided. The circuit includes two PMOS amplification modules and two NMOS amplification modules; each module includes a CSCG structure composed of a stack of K transistors. The first PMOS module and the first NMOS module are connected in series between a supply voltage and ground; gates of main amplification transistors of the first PMOS module and the first NMOS module are connected to a non-inverting input, and outputs of the first PMOS module and the first NMOS module are connected together to form an inverting output. The second PMOS module and the second NMOS module are similarly connected. Both the first and the second modules will be connected side-by-side as a pseudo differential structure to provide double push-pull function to the load. The present disclosure simultaneously achieves high power efficiency, and high linearity.

14 Claims, 6 Drawing Sheets

FULLY INTEGRATED CMOS MULTIPLE MOSFET-STACKED DOUBLE PUSH-PULL RF POWER AMPLIFIER

CROSS REFERENCE TO RELATED APPLICATION

The present application claims the benefit of priority to Chinese Patent Application No. CN 2022113128652, entitled “MAIN AMPLIFICATION CIRCUIT AND RF POWER AMPLIFIER”, filed with CNIPA on Oct. 25, 2022, the disclosure of which is incorporated herein by reference in its entirety for all purposes.

FIELD OF TECHNOLOGY

The present disclosure generally relates to integrated circuit design, and in particular to a main amplification circuit and an RF power amplifier.

BACKGROUND

With the emergence of 5G and 6G communication technologies, communication devices are required to support more and more frequency bands at the same time, and as a result, commercial semiconductor chips have an increasingly higher integration density, which leads to numerous problems related to chip heat dissipation, reliability, lifespan, cost, etc. In light of current semiconductor processes, the only ways to effectively overcome the above challenges are to maximize the efficacy, performance (linearity), and integration of modules on the chip.

RF power amplifiers are key modules in RF chips, with them accounting for nearly half (40 to 50%) of the RF chips' power consumption. As shown in FIG. 1, the main function of Amplifier 2 is to amplify RF signals provided by Frequency Converter 1 and then drive Antenna 4 through Balun 3 in order to transmit wireless signals into space. Ideally, Amplifier 2 should amplify and transmit signals at its input to Antenna 4 without distortion, and with minimum on-chip power loss. Therefore, it is of critical importance to improve power efficiency, linearity, and integration of amplifiers. In addition, because signal transmission distance is related to power, the balance between a large output power of an amplifier and its linearity should also be taken into consideration.

In some examples, as shown in FIG. 2, Amplifier 2 is an integrated RF power amplifier, which includes two stages of amplifiers. In the first stage is a preamplifier 2*a*, whose main function is to initially amplify an input signal and isolate the input of Amplifier 2 from a main amplifier. In the second stage is the main amplifier 2*c*, where the amplification and enhancement of signals is mainly achieved; that is, the main amplifier 2*c* largely determines the efficiency, linearity, and output power of the entire RF power amplifier. A matching circuit 2*b* is also provided between the preamplifier 2*a* and the main amplifier 2*c* for impedance matching. Generally, the structure of the preamplifier 2*a* is similar or identical to the structure of the main amplifier 2*c*. Basic transistors M1 and M2 in the main amplifier 2*c* form a differential pair, referred to as main amplification transistors. In order to obtain high output power, the supply voltage Vdd of the main amplifier 2*c* is generally much higher than the rated operating voltage of the core transistors M1 and M2 (transistors operating above the rated operating voltage are easily broken or burned out). For example, in 22 nm CMOS process the rated operating voltage of the core transistors is less than 1.2V. In order to obtain an output power of about 1 W, the supply voltage Vdd must be greater than 3.2V. Therefore, in order to ensure the safe operation of the transistors, a further set of transistors M3 and M4 are stacked on top of the transistors M1 and M2 to share the voltage drop. Because having to withstand a voltage of more than 1.2V, the transistors M3 and M4 cannot be core transistors, and should be high-voltage transistors instead. This will not only result in large die area, but also inevitably limit the achievable maximum power efficiency of the amplifier.

Both transistors M1 and M2 and transistors M3 and M4 have strong nonlinear characteristics when it comes to large signals, and therefore transistors M5 and M6 are needed to compensate for some of the nonlinearity; but adding the transistors M5 and M6 undoubtedly increases capacitive load in the second input stage, which reduces the power efficiency. Also, transistors M5 and M6 can only compensate for capacitive nonlinearity of the transistors M1 and M2, and other types of nonlinearities in M5 and M6 can only be partially cancelled, by push-pull characteristics of the differential pair M3 and M4; therefore, a considerable amount of nonlinearity will arrive at the load RL and limit the linearity of Amplifier 2. In addition, as shown in FIG. 3, the duration in which a non-zero DA output current ID and a non-zero DA output voltage Vout simultaneously occurring at the output of the main amplifier 2*c* due to signal distortion will be longer, causing extra power consumption (represented by the dashed region), thus further limiting the power efficiency of the entire amplifier.

In addition, with the increase of output power, when there is output impedance mismatch, the transistors M3 and M4 will be subjected to higher voltage and higher risk of damage, and therefore, it will be necessary to add an output mismatch voltage-standing-wave-ratio (VSWR) protection circuit (not shown in the figures), which, however, will also increase the manufacturing cost.

In summary, the RF power amplifier 2 in FIG. 2 has the following problems: 1) The high-voltage transistors M3 and M4 limit the power efficiency that the amplifier can achieve; transistors M3 and M4 (compared to the core transistors M1 and M2) not only have smaller transconductance gain, but also have larger capacitive parasitic parameters, and thus will consume more power. 2) Nonlinear characteristics related to large signals are not sufficiently compensated for, and the compensating components (i.e., the transistors M5 and M6) themselves also consume power, making it difficult to achieve both high power efficiency and high linearity. 3) Due to the fact that transistors in common CMOS process usually have a low transconductance gain, a simple differential push-pull amplification cannot provide sufficient driving to its corresponding load, which will increase an overlapping area of the non-zero voltage and non-zero current at the output of the amplifier, thus further limiting the power efficiency of the amplifier. 4) The transistors M3 and M4 have to withstand voltages up to two times the supply voltage Vdd, making it challenging to further increase the supply voltage Vdd. 5) An output mismatch VSWR protection circuit is needed, which again increases the manufacturing cost. Therefore, how to improve power efficiency, linearity, integration, and output power of amplifiers while reducing the cost has become an urgent problem facing technical personnel in the field.

It should be noted that the above introduction to the technical background is only for the convenience of a clear and complete description of the technical solution of the present disclosure, and to facilitate the understanding of those skilled in the art. It should not be considered that the above technical solutions are well-known to those skilled in the art just because these solutions are described in the background part of the present disclosure.

SUMMARY

The present disclosure provides a main amplification circuit and an RF power amplifier to offer an RF power amplifier with high power efficiency, high performance, high integration, high output power and low cost.

The main amplification circuit is applied to an RF power amplifier, and the main amplification circuit includes: two PMOS amplification modules and two NMOS amplification modules, wherein each PMOS amplification module comprises a common-source-common-gate (CSCG) structure formed by a stack of K PMOS transistors, and each NMOS transistor amplification module comprises a CSCG structure formed by a stack of K NMOS transistors, with K being a natural number greater than or equal to 3 and less than or equal to 5; wherein a first PMOS amplification module and a first NMOS amplification module are connected in series between a supply voltage and ground; wherein a gate of a main amplification transistor of the first PMOS amplification module and a gate of a main amplification transistor of the first NMOS amplification module are connected to a non-inverting input of the main amplification circuit, and a connection node of the first PMOS amplification module and the first NMOS amplification module is connected to an inverting output of the main amplification circuit; wherein a second PMOS amplification module and a second NMOS amplification module are connected in series between a supply voltage and ground; wherein a gate of a main amplification transistor of the second PMOS amplification module and a gate of a main amplification transistor of the second NMOS amplification module are connected to an inverting input of the main amplification circuit; wherein a connection node of the second PMOS amplification module and the second NMOS amplification module is connected to a non-inverting output of the main amplification circuit; wherein gates of the transistors in the PMOS amplification modules and the NMOS amplification modules are connected to corresponding bias voltages respectively.

Optionally, bias voltages of main amplification transistors in the two PMOS amplification modules and the two NMOS amplification modules are generated by the same bias current.

Optionally, each CSCG structure comprises a last-stage transistor that is next to an output of the main amplification circuit, and each last-stage transistor has a gate connected to a corresponding RC module; wherein each RC module comprises a first resistor and a first capacitor; wherein the first resistor is connected between the gate and a drain of the corresponding last-stage transistor; wherein a first end of the first capacitor is connected to the gate of the corresponding last-stage transistor, a second end of the first capacitor is connected to the supply voltage when the first capacitor is in one of the two PMOS amplification modules, and the second end of the first capacitor is grounded when the first capacitor is in one of the two NMOS amplification modules.

Optionally, each CSCG structure comprises an intermediate-stage transistor, which has a gate receiving a corresponding bias voltage and connected to a first end of a corresponding gate capacitor; wherein a second end of the gate capacitor is connected to the supply voltage when the gate capacitor is in one of the two PMOS amplification modules, and the second end of the gate capacitor is grounded when the gate capacitor is in one of the two NMOS amplification modules.

Optionally, K is 3.

Optionally, the supply voltage is between 3V and 5.5V (5.5V is corresponding to k=5).

Optionally, each CSCG structure comprises a main amplification transistor, which has a gate connected to a corresponding input of the main amplification circuit via an input capacitor.

The present disclosure also provides an RF power amplifier, including: a pre-amplification circuit, a first impedance matching circuit, a second impedance matching circuit, and a main amplification circuit described above; wherein the pre-amplification circuit receives an RF input signal from its inputs, initially amplifies the RF input signal, and compensates for distortion due to the main amplification circuit; wherein the first impedance matching circuit is connected between outputs of the pre-amplification circuit and inputs of the main amplification circuit for achieving impedance matching between the pre-amplification circuit and the main amplification circuit; wherein the main amplification circuit amplifies output signals of the first impedance matching circuit; wherein the second impedance matching circuit is connected to outputs of the main amplification circuit for achieving impedance matching between the main amplification circuit and an output side of the RF power amplifier.

Optionally, the pre-amplification circuit includes a first PMOS differential amplification module and a first NMOS differential amplification module.

A source of the first PMOS differential amplification module is connected to a supply voltage of the pre-amplification circuit, differential inputs of the first PMOS differential amplification module 221 are connected to a non-inverting input and an inverting input of the pre-amplification circuit, respectively, differential outputs of the first PMOS differential amplification module are connected to an inverting output and a non-inverting output of the pre-amplification circuit, respectively; a source of the first NMOS differential amplification module is grounded, differential inputs of the first NMOS differential amplification module are connected to a non-inverting input and an inverting input of the pre-amplification circuit, respectively, and differential outputs of the first NMOS differential amplification module are connected to an inverting output and a non-inverting output of the pre-amplification circuit, respectively; gates of input-stage transistors in the first PMOS differential amplification modules are connected to the same bias voltage; wherein gates of input-stage transistors in the first NMOS differential amplification modules are connected to the same bias voltage.

Optionally, each of the gates of the input-stage transistors in the first PMOS differential amplification module is connected to a corresponding input of the pre-amplification circuit via an input capacitor, and each of the gates of the input-stage transistors in the first NMOS differential amplification module is also connected to a corresponding input of the pre-amplification circuit via an input capacitor.

Optionally, the pre-amplification circuit comprises a first common-source common-gate (CSCG) module and a second CSCG module, an input of the first CSCG module is connected to a non-inverting input of the pre-amplification circuit, and an output of the first CSCG module is connected to an inverting output of the pre-amplification circuit; wherein an input of the second CSCG module is connected to an inverting input of the pre-amplification circuit, and an output of the second CSCG module is connected to a non-inverting output of the pre-amplification circuit.

Optionally, the RF power amplifier further includes an input buffer circuit, a third impedance matching circuit, and a fourth impedance matching circuit; wherein the third impedance matching circuit is connected between the RF input signal and an input of the input buffer circuit for impedance matching between an input side of the RF power amplifier and the input buffer circuit; wherein the fourth impedance matching circuit is connected between outputs of the input buffer circuit and the inputs of the pre-amplification circuit for achieving impedance matching between the input buffer circuit and the pre-amplification circuit.

Optionally, the input buffer circuit comprises a current source, a second PMOS differential amplification module and a second NMOS differential amplification module.

One end of the current source is connected to a supply voltage of the input buffer circuit and the other end of the current source is connected to a source of the second PMOS differential amplification module; differential inputs of the second PMOS differential amplification module are connected to a non-inverting input and an inverting input of the input buffer circuit, and differential outputs of the second PMOS differential amplification module are connected to an inverting output and a non-inverting output of the input buffer circuit, respectively; a source of the second NMOS differential amplification module is grounded, differential inputs of the second NMOS differential amplification module are connected to a non-inverting input and an inverting input of the input buffer circuit, and differential outputs of the second NMOS differential amplification module are connected to an inverting output and a non-inverting output of the input buffer circuit, respectively; a resistor is provided between a gate and a drain of each transistor in the second PMOS differential amplification module and the second NMOS differential amplification module, each of inputs of the second PMOS differential amplification module and the second NMOS differential amplification module is connected to a corresponding differential input of the input buffer circuit through an input capacitor.

Optionally, the second PMOS differential amplification module is further connected with a ground capacitor at a connection node with the current source.

Optionally, each of the impedance matching circuits is an inductive transformer.

Therefore, the main amplification circuit and the RF power amplifier of the present disclosure have the following beneficial effects:

1. The main amplification circuit and the RF power amplifier of the present disclosure adopts stacks of PMOS transistors and stacks of NMOS transistors to form a double push-pull amplifier architecture, using double push-pull to shorten the duration in which the non-zero voltage and non-zero current overlap (i.e., simultaneously occur) at the output of the circuit, thus effectively improving the power efficiency of the circuit.
2. The main amplification circuit and the RF power amplifier of the present disclosure utilize RC filter structures and the principle of capacitive voltage dividing, achieving uniform distribution of a high supply voltage among three stacked core transistors.
3. In the main amplification circuit and the RF power amplifier of the present disclosure, a PMOS main amplification transistor shares the same bias DC current with a NMOS main amplification transistor, which increases the power efficiency of the circuit.
4. In the main amplification circuit and the RF power amplifier of the present disclosure, parallel-connected NMOS main amplification transistor(s) gates and PMOS main amplification transistor(s) gates (which are all core transistors) make it possible to automatically compensate for nonlinear capacitance of transistors, and power efficiency is increased without introducing additional components.
5. In the main amplification circuit and the RF power amplifier of the present disclosure, nonlinear transconductance gain in the PMOS transistors and nonlinear transconductance gain in the NMOS transistors can be canceled out or partially canceled out by back-to-back connecting stacks of the PMOS transistors and stacks of the NMOS transistors, effectively improving linearity.
6. In the main amplification circuit and the RF power amplifier of the present disclosure, back-to-back connecting stacks of the PMOS transistors and stacks of the NMOS transistors also ensures that the voltage at any connection node of the core transistors in the main amplification circuit will not exceed the supply voltage of the main amplification circuit in any case, and therefore there is no longer the need to introduce a VSWR voltage protection circuit, further reducing the cost.

REFERENCE NUMERALS

Figure 1:
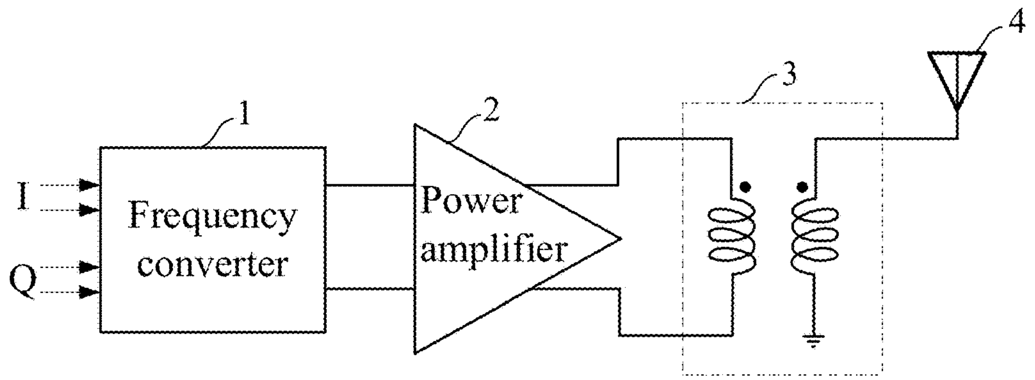
FIG. 1 (prior art)
FIG. 1 illustrates an operating principle of an RF power amplifier in the prior art.

1 Frequency converter
2 RF power amplifier
**2*a*** Preamplifier
**2*b*** Matching circuit
**2*c*** Main amplifier
21 Main amplification circuit

211 First PMOS amplification module
212 Second PMOS amplification module
213 First NMOS amplification module
214 Second NMOS amplification module
215~218 First-Fourth RC modules
22 Pre-amplification circuit
221 First PMOS differential amplification module
222 First NMOS differential amplification module
223 First CSCG module
224 Second CSCG module
23 First impedance matching circuit
24 Second impedance matching circuit
25 Input buffer circuit
251 Second PMOS differential amplification module
252 Second NMOS differential amplification module
26 Third impedance matching circuit
27 Fourth impedance matching circuit
3 Balun
4 Antenna

DETAILED DESCRIPTION

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIG. 4 to FIG. 11. It needs to be stated that the drawings provided in the following embodiments are just used for schematically describing the basic concept of the present disclosure, thus only illustrating components closely related to the present disclosure and are not necessarily drawn according to the numbers, shapes and sizes of components during actual implementation, the configuration, number and scale of each component during actual implementation thereof may be freely changed, and the component layout configuration thereof may be more complicated.

Embodiment 1

Figure 4:
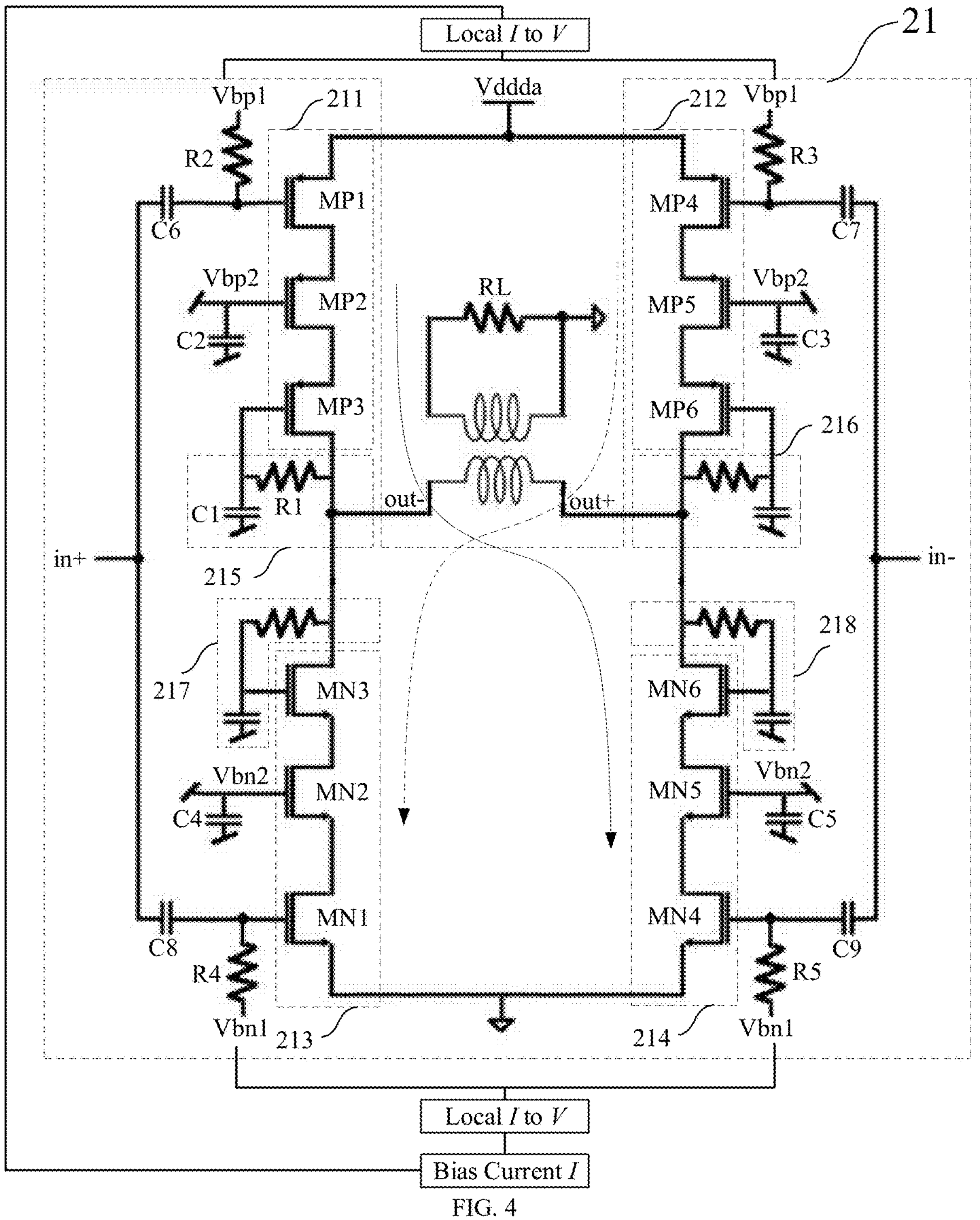
FIG. 4 shows a schematic structural diagram of a main amplification circuit according to an embodiment of the present disclosure.

As shown in FIG. 4, Embodiment 1 provides a main amplification circuit 21, applied in an RF power amplifier 2, and the main amplification circuit 21 includes:

two PMOS amplification modules including a first PMOS amplification module 211 and a second PMOS amplification module 212; and two NMOS amplification modules including a first NMOS amplification module 213 and a second NMOS amplification module 214. The first PMOS amplification module 211 and the first NMOS amplification module 213 are connected in series between the supply voltage Vddda and ground. A gate of a main amplification transistor of the first PMOS amplification module 211 and a gate of a main amplification transistor of the first NMOS amplification module 213 are connected to a non-inverting input in+ of the main amplification circuit 21. A connection node of the first PMOS amplification module 211 and the first NMOS amplification module 213 is connected to an inverting output out− of the main amplification circuit 21. The second PMOS amplification module 212 and the second NMOS amplification module 214 are connected in series between the supply voltage Vddda and ground. A gate of a main amplification transistor of the second PMOS amplification module 212 and a gate of a main amplification transistor of the second NMOS amplification module 214 are connected to an inverting input in− of the main amplification circuit 21. A connection node of the second PMOS amplification module 212 and the second NMOS amplification module 214 is connected to a non-inverting output end out+ of the main amplification circuit 21.

Specifically, the first PMOS amplification module 211 and the second PMOS amplification module 212 form a differential pair of PMOS transistors, and the first NMOS amplification module 213 and the second NMOS amplification module 214 form a differential pair of NMOS transistors, each realizing a differential push-pull function. The two differential pairs are connected back-to-back to realize another stage of push-pull function superimposed on top of the differential pairs (the solid and dashed lines with arrows in FIG. 4 respectively indicate two conduction paths with different input signals), wherein when the first PMOS amplification module 211 and the second NMOS amplification module 214 are on, the second PMOS amplification module 212 and the first NMOS amplification module 213 are off; when the second PMOS amplification module 212 and the first NMOS amplification module 213 are on, the first PMOS amplification module 211 and the second NMOS amplification module 214 are off. Thus, a double push-pull effect is realized for the load RL, and the double push-pull effect shortens transitional intervals in signal waveforms at the output of the circuit, and thus shortens the duration that the non-zero voltage and the non-zero current simultaneously occur at the output, therefore improving the power efficiency of the main amplification circuit 21.

More specifically, as for input signals, the main amplification transistor MP1 in the first PMOS amplification module 211 and the main amplification transistor MN1 in the first NMOS amplification module 213 are parallel transistors having the same input signal (i.e., non-inverting input signal of the main amplification circuit 21), and the main amplification transistor MP4 in the second PMOS amplification module 212 and the main amplification transistor MN4 in the second NMOS amplification module 214 are parallel transistors having the same input signal (i.e., inverting input signal of the main amplification circuit 21). Therefore, the main amplification circuit 21 of the present disclosure does not need additional transistors M5 and M6 as in the scheme of FIG. 2 to compensate for non linearity caused by the nonlinear capacitance, which also prevents the parasitic effect caused by the transistors M5 and M6. Compared to prior art, the main amplification circuit 21 of the present disclosure therefore achieves a higher power efficiency while maintaining the same or better linearity. Moreover, the nonlinearity in the main amplification circuit 21 comes not only from nonlinear capacitance at inputs of the transistors, but also from nonlinear transconductance gain of the transistors themselves. The scheme of FIG. 2 compensates for the nonlinear capacitance of the transistors M5 and M6, but does nothing about the corresponding nonlinear transconductance gain. In the present disclosure, one PMOS transistor and one NMOS transistor are connected back-to-back to cancel out nonlinear transconductance in the PMOS transistor and nonlinear transconductance in the NMOS transistor; as shown in FIG. 4, nonlinear transconductance of the PMOS transistors MP1, MP2, MP3 (or MP4, MP5, MP6) and the NMOS transistors MN1, MN2, MN3 (or MN4, MN5, MN6) will "flow" from the power supply to the ground through MP1, MP2, MP3, MN3, MN2, MN1 (or MP4, MP5, MP6, MN6, MN5, MN4), and won't be shared by the load RL, thus effectively improving linearity.

As shown in FIG. 4, each PMOS amplification module includes a common-source-common-gate (CSCG, or cascode) structure formed by a stack of K PMOS transistors, and each NMOS transistor amplification module includes a CSCG structure formed by a stack of K NMOS transistors, with K being a natural number greater than or equal to 3 and less than or equal to 5, that is, one of 3, 4, 5.

Specifically, in the embodiment as shown in FIG. 4, K is 3 as an example. In actual implantation, the number of transistors in each PMOS amplification module and each NMOS amplification module can be configured as needed. Specifically, in the embodiment as shown in FIG. 4, the first PMOS amplification module 211 includes a first PMOS transistor MP1, a second PMOS transistor MP2, and a third PMOS transistor MP3. A source of the first PMOS transistor MP1 is connected to the supply voltage Vddda, a gate of the first PMOS transistor MP1 is connected to the non-inverting input in+ of the main amplification circuit 21 and a drain of the first PMOS transistor MP1 is connected to a source of the second PMOS transistor MP2. A drain of the second PMOS transistor MP2 is connected to a source of the third PMOS transistor MP3. A drain of the third PMOS transistor MP3 is connected to the inverting output out− of the main amplification circuit 21. Gates of the first PMOS transistor MP1, the second PMOS transistor MP2 and the third PMOS transistor MP3 are connected to corresponding bias voltages. At this point, the first PMOS amplification module 211 constitutes a CSCG structure, wherein the first PMOS transistor MP1 is the main amplification transistor of the input stage. Similarly, the second PMOS amplification module 212 includes a fourth PMOS transistor MP4, a fifth PMOS transistor MP5 and a sixth PMOS transistor MP6, wherein a gate of the fourth PMOS transistor MP4 is connected to the inverting input in− of the main amplification circuit 21, and a drain of the sixth PMOS transistor MP6 is connected to the non-inverting output out+ of the main amplification circuit 21; the connections between the PMOS transistors of the second PMOS amplification module 212 are the same as those of the first PMOS amplification module 211.

Specifically, in the embodiment as shown in FIG. 4, the first NMOS amplification module 213 includes a first NMOS transistor MN1, a second NMOS transistor MN2, and a third NMOS transistor MN3. A source of the first NMOS transistor MN1 is grounded, a gate of the first NMOS transistor MN1 is connected to the non-inverting input in+ of the main amplification circuit 21, and a drain of the first NMOS transistor MN1 is connected to a source of the second NMOS transistor MN2. A drain of the second NMOS transistor MN2 is connected to a source of the third NMOS transistor MN3. A drain of the third NMOS transistor MN3 is connected to the inverting output out− of the main amplification circuit 21. Gates of the first NMOS transistor MN1, the second NMOS transistor MN2 and the third NMOS transistor MN3 are connected to corresponding bias voltages. At this point, the first NMOS amplification module 213 constitutes a CSCG structure, wherein the first NMOS transistor MN1 is the main amplification transistor of the input stage. Similarly, the second NMOS amplification module 214 includes a fourth NMOS transistor MN4, a fifth NMOS transistor MN5 and a sixth NMOS transistor MN6, wherein a gate of the fourth NMOS transistor MN4 is connected to the inverting input in− of the main amplification circuit 21, and a drain of the sixth NMOS transistor MN6 is connected to the non-inverting output out+ of the main amplification circuit 21; the connections between the NMOS transistors of the second NMOS amplification module 212 are the same as those of the first NMOS amplification module 213.

In one embodiment, the supply voltage Vddda is 3V~5.5V, wherein 5.5V corresponds to K=5, so that the output power of the main amplification circuit is about 1 W. In another embodiment, the supply voltage Vddda is 3.3V. In actual implantation, the value of the supply voltage can be configured as needed.

Figure 2:
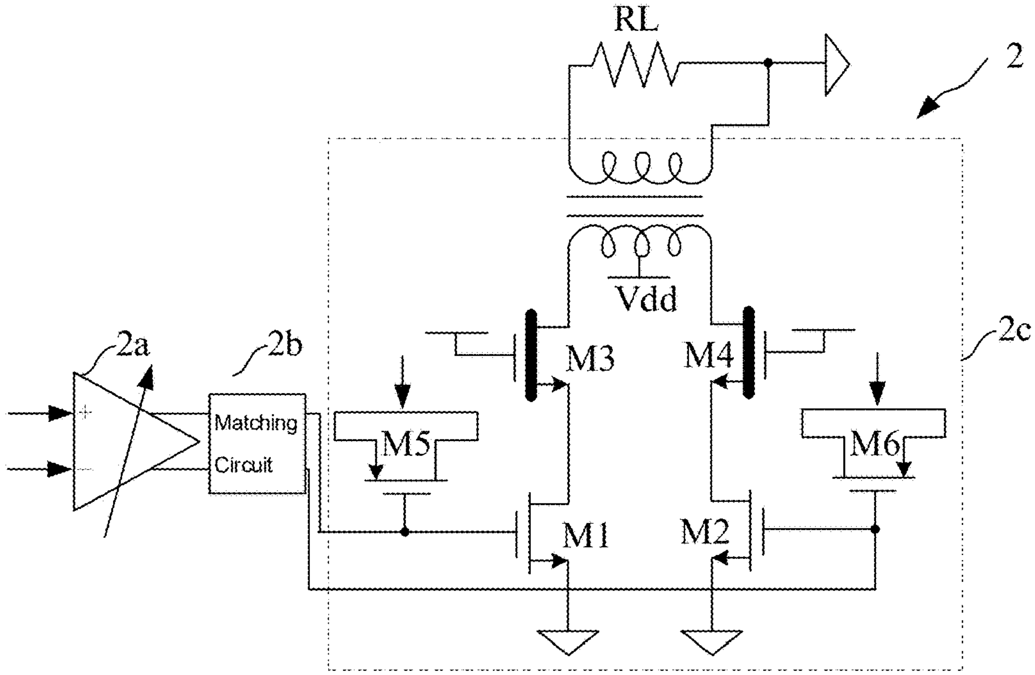
FIG. 2(prior art)
FIG. 2 shows a schematic structural diagram of an RF power amplifier in the prior art.
Figure 3:
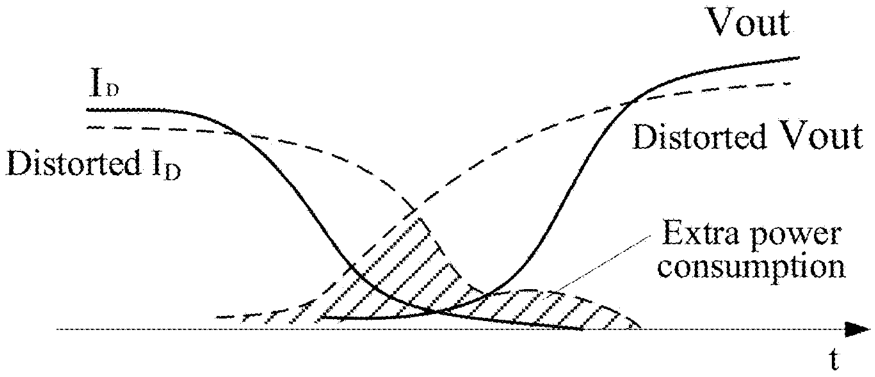
FIG. 3(prior art)
FIG. 3 shows loss due to signal distortion in the prior art.
Figure 5:
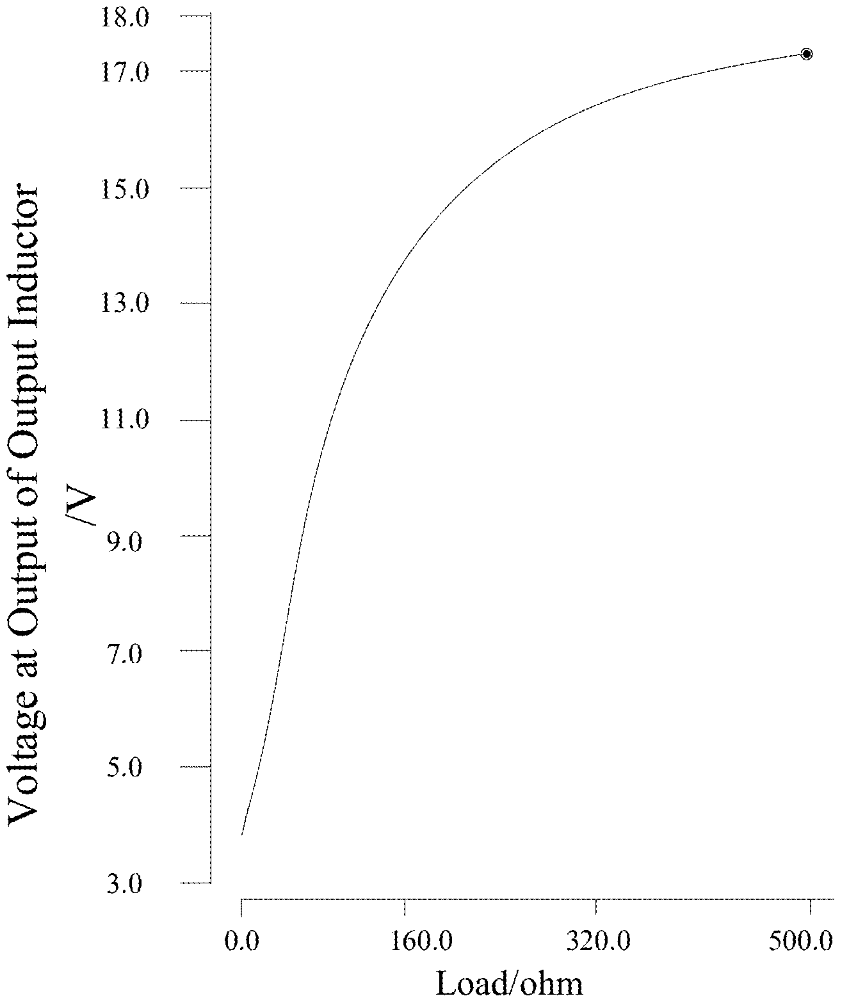
FIG. 5 is a curve showing an output voltage across an output inductor varying with load when there is output mismatch according to one embodiment of the present disclosure.
Figure 6:
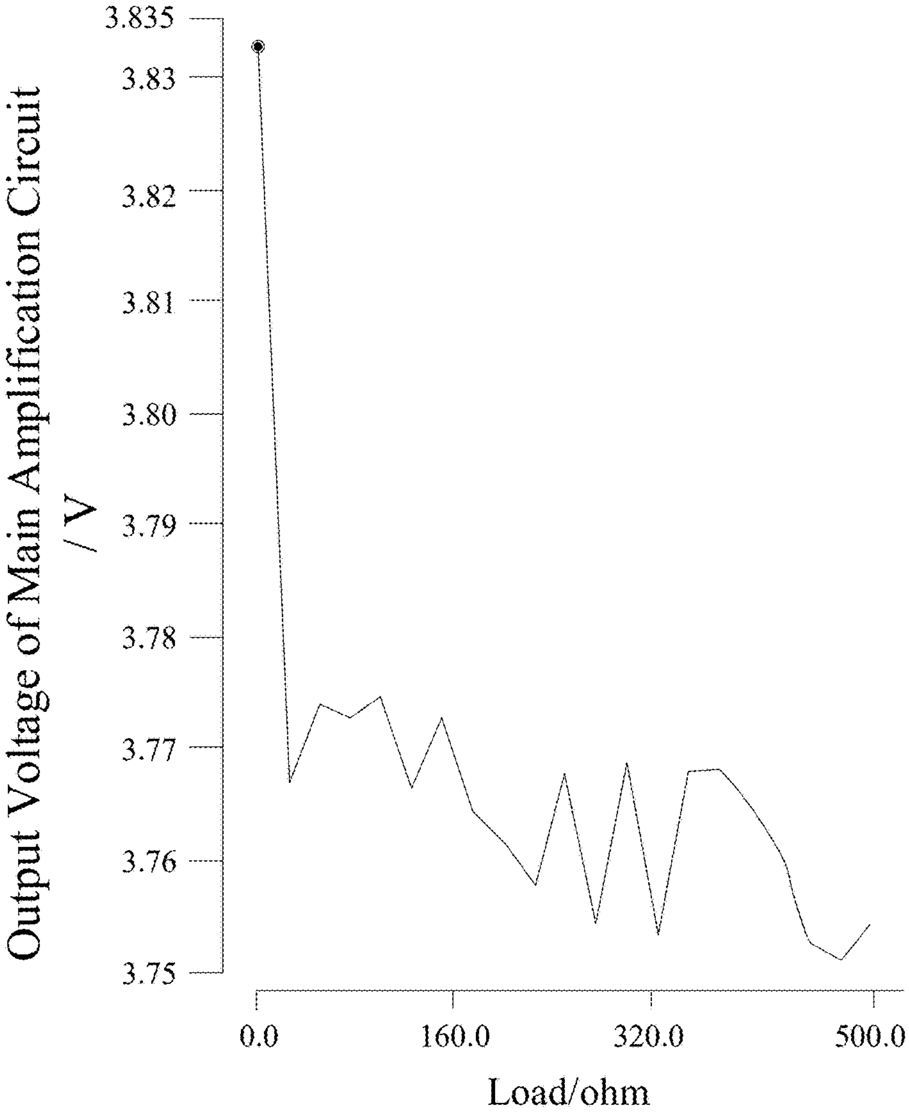
FIG. 6 is a curve showing an output voltage of a main amplification circuit varying with load when there is output mismatch according to one embodiment of the present disclosure.

In one embodiment, each transistor in the main amplification circuit 21 is a core transistor, and compared with the scheme in FIG. 2 using high-voltage MOS transistors, the main amplification circuit 21 of the present disclosure not only has a smaller parasitic parameter but also has a larger transconductance gain, and therefore has an increased power efficiency. In one embodiment, K is 3, as shown in FIG. 4, where the back-to-back connection of the stack of three PMOS transistors and the stack of three NMOS transistors ensures that the voltage at any connection node of the core transistors in the main amplification circuit 21 will not exceed the supply voltage Vddda of the main amplification circuit 21 in any case. As shown in FIG. 5, the peak voltage at an output of an output inductor (the main amplification circuit 21 is connected to the load RL through the output inductor) during output mismatch (RL: 1 to 500 ohm) exceeds 17V at RL=500 ohm; as shown in FIG. 6, however, the peak value of the output voltage of the main amplification circuit 21 during output mismatch (RL: 1 to 500 ohm) is less than 4V at RL=1 ohm, with a small output power even at the time of severe impedance mismatch; therefore, there is no need for any additional VSWR voltage protection circuit, which effectively saves on chip related costs.

As shown in FIG. 4, gates of the transistors in the PMOS amplification modules and the NMOS amplification modules are connected to corresponding bias voltages respectively.

Specifically, as an example, the gate of the first PMOS transistor MP1 is connected to a first bias voltage Vbp1 through a second resistor R2, a gate of the fourth PMOS transistor MP4 is connected to the first bias voltage Vbp1 through a third resistor R3 (with the same resistance value as the second resistor R2), a gate of the second PMOS transistor MP2 and a gate of the fifth PMOS transistor MP5 are connected to a second bias voltage Vbp2, and a gate of the third PMOS transistor MP3 and a gate of the sixth PMOS transistor MP6 are connected to a third bias voltage. The gate of the first NMOS transistor MN1 is connected to a fourth bias voltage Vbn1 through a fourth resistor R4, a gate of the fourth NMOS transistor MN4 is connected to the fourth bias voltage Vbn1 through a fifth resistor R5 (with the same resistance value as the fourth resistor R4), a gate of the second NMOS transistor MN2 and a gate of the fifth NMOS transistor MN5 are connected to a fifth bias voltage Vbn2, a gate of the third NMOS transistor MN3 and a gate of the sixth NMOS transistor MN6 are connected to a sixth bias voltage. Each bias voltage is provided by a normal and general bias generation circuit (not shown in the Figures).

In one embodiment, a transistor in the first PMOS amplification module 211 has the same bias voltage as a corresponding transistor in the second PMOS amplification module 212, and a transistor in the first NMOS amplification module 213 has the same bias voltage as a corresponding transistor in the second NMOS amplification module 214. Take the PMOS amplification modules as an example, MP1 corresponds to MP4, MP2 corresponds to MP5, MP3 corresponds to MP6. In actual implementation, the bias voltage of each transistor may be configured as needed.

Specifically, as another example, the gates of the first PMOS transistor MP1, the second PMOS transistor MP2, the fourth PMOS transistor MP4, the fifth PMOS transistor MP5, the first NMOS transistor MN1, the second NMOS transistor MN2, the fourth NMOS transistor MN4, and the fifth NMOS transistor MN5 all receive bias voltages from a normal bias generator (as in the previous example). The gate of the third PMOS transistor MP3 is connected to a first RC module 215, with self-biasing provided by the first RC module 215. The first RC module 215 includes a first resistor R1 and a first capacitor C1, the first resistor R1 being connected between the gate and the drain of the third PMOS transistor MP3, one end of the first capacitor C1 being connected to the gate of the third PMOS transistor MP3 and the other end of the first capacitor C1 being connected to the supply voltage Vddda. The gate of the sixth PMOS transistor MP6 is connected to a second RC module 216, whose components, structure and parameters are the same as those of the first RC module 215 in one embodiment. The gate of the third NMOS transistor MN3 is connected to a third RC module 217, which has basically the same structure as the first RC module 215, except that one end of the capacitor in the third RC module 217 is connected to the gate of the third NMOS transistor MN3, and the other end of this capacitor is grounded. The gate of the sixth NMOS transistor MN6 is connected to the fourth RC module 218, whose components, structure and parameters are the same as those of the third RC module 217.

In one embodiment, the device parameters of the first RC module 215 and the second RC module 216 are the same, and the device parameters of the third RC module 217 and the fourth RC module 218 are the same. In actual implementation, the above-mentioned device parameters can be configured as needed.

As shown in FIG. 4, as an implementation of the present disclosure, the bias voltages of main amplification transistors in the PMOS amplification modules and the NMOS amplification modules are generated by the same bias current; for example, the same bias current is mirrored by a master-slave replication circuit composed of mirrored current sources, which in turn yields the first bias voltage Vbp1 and the fourth bias voltage Vbn1, which are then applied to corresponding gates respectively through corresponding resistors R2, R3, R4 and R5. In the present disclosure, the P-type main power transistor of the present disclosure shares the same DC bias current with the N-type main power transistor. With the same DC bias current, the transconductance gain of the main amplification transistors of the present disclosure is twice that of the main amplification transistors of FIG. 2 (assuming that NMOS is the same as PMOS), so the main amplification circuit 21 of the present disclosure has a higher power efficiency.

As shown in FIG. 4, as an embodiment of the present disclosure, the gates of intermediate-stage transistors of each PMOS amplification module and each NMOS amplification module are each connected to a gate capacitor, wherein the intermediate-stage transistors are the transistors of each amplification module between the corresponding main amplification transistor and the transistor closest to the outputs of the main amplification circuit 21; for example, MP2, MP5, MN2, MN5 are intermediate-stage transistors. In one embodiment, the gate of the second PMOS transistor MP2 is connected to a first end of a first gate capacitor C2, the gate of the fifth PMOS transistor MP5 is connected to a first end of a second gate capacitor C3, and second ends of the first gate capacitor C2 and the second gate capacitor C3 are connected to the supply voltage Vddda. The gate of the second NMOS transistor MN2 is connected to a first end of a third gate capacitor C4, the gate of the fifth NMOS transistor MN5 is connected to a first end of a fourth gate capacitor C5, and second ends of the third gate capacitor C4 and the fourth gate capacitor C5 are grounded.

In one embodiment, each RC module is responsible for ensuring that the voltage difference across each of the transistors (the third PMOS transistor MP3, the sixth PMOS transistor MP6, the third NMOS transistor MN3 and the sixth NMOS transistor MN6) closest to the outputs of the main amplification circuit 21 does not exceed their rated voltage (as an example, about 1.2V) and that the gate capacitors (the first gate capacitor C2, the second gate capacitor C3, the third gate capacitor C4 and the fourth gate capacitor C5) determines that the remaining supply voltage can be shared approximately equally by the intermediate-stage transistors (the second PMOS transistor MP2, the fifth PMOS transistor MP5, the second NMOS transistor MN2 and the fifth NMOS transistor MN5) and the main amplification transistors (the first PMOS transistor MP1, the fourth PMOS transistor MP4, the first NMOS transistor MN1 and the fourth NMOS transistor MN4), so that the 3.3V supply voltage can be distributed substantially equally to the three stacked transistors in each module, thus ensuring safe operation of all transistors.

As shown in FIG. 4, as an implementation of the present disclosure, the gate of each main amplification transistor is also connected to a corresponding input of the main amplification circuit 21 through an input capacitor. The gates of the first PMOS transistor MP1 and the first NMOS transistor MN1 are connected to the non-inverting input in+ of the main amplification circuit 21 through a first input capacitor C6 and a third input capacitor C8, respectively; the gates of the fourth PMOS transistor MP4 and the fourth NMOS transistor MN4 are connected to the inverting input in− of the main amplification circuit 21 through a second input capacitor C7 and a fourth input capacitor C9, respectively. The input capacitors are used to isolate DC voltage of the inputs of the main amplification circuit 21 from outputs of a previous stage (in this case, an input of the main amplification circuit 21 is connected to a corresponding output of the previous stage with the same polarity), and when the inputs of the main amplification circuit 21 are connected to the outputs of the previous stage in a crossed manner (in this case, an input of the main amplification circuit 21 is connected to a corresponding output of the previous stage with the opposite polarity), the input capacitors can be removed.

The main amplification circuit 21 simultaneously achieves low noise, high power efficiency, high linearity, high integration, and low cost compared with the main amplifier 2*c* of FIG. 2, and the improvement in power efficiency is more than 60%.

Embodiment 2

Embodiment 2 provides a main amplification circuit 21, which differs from Embodiment 1 in that K is 4 or 5 in Embodiment 2.

Specifically, each amplification module includes 4 or 5 transistors, which may be archived by adding corresponding numbers of intermediate-stage transistors to the stacks of transistors of Embodiment 1, and each transistor is a core transistor.

The main amplification circuit 21 of this embodiment has the advantages of high linearity, high integration, high power efficiency and low cost. It should be noted that the increase in the number of transistors in each stack of transistors creates more gate voltage bias problems and tends to cause parasitic oscillations, making it more difficult to maintain normal amplification functions of the main amplification circuit 21. At the same time, the headroom voltage of each transistor becomes smaller, which will reduce the transconductance gain of each transistor. The power efficiency of the main amplification circuit will also be affected.

Otherwise, the structure and operating principle of Embodiment 2 are the same as those of Embodiment 1.

Embodiment 3

Figure 7:
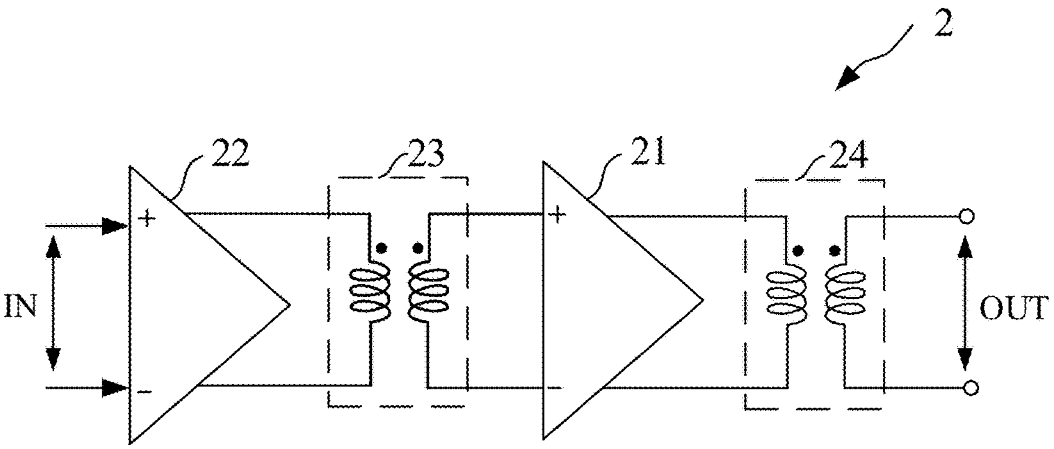
FIG. 7 shows a schematic structural diagram of an RF power amplifier according to one embodiment of the present disclosure.

As shown in FIG. 7, Embodiment 3 provides an RF power amplifier 2, including:

a main amplification circuit 21, a pre-amplification circuit 22, a first impedance matching circuit 23 and a second impedance matching circuit 24, wherein the RF power amplifier 2 is in a two-stage amplification structure.

As shown in FIG. 7, the pre-amplification circuit 22 receives an RF input signal IN from its inputs, initially amplifies the RF input signal IN, and compensates for distortion due to the main amplification circuit 21.

Figure 8:
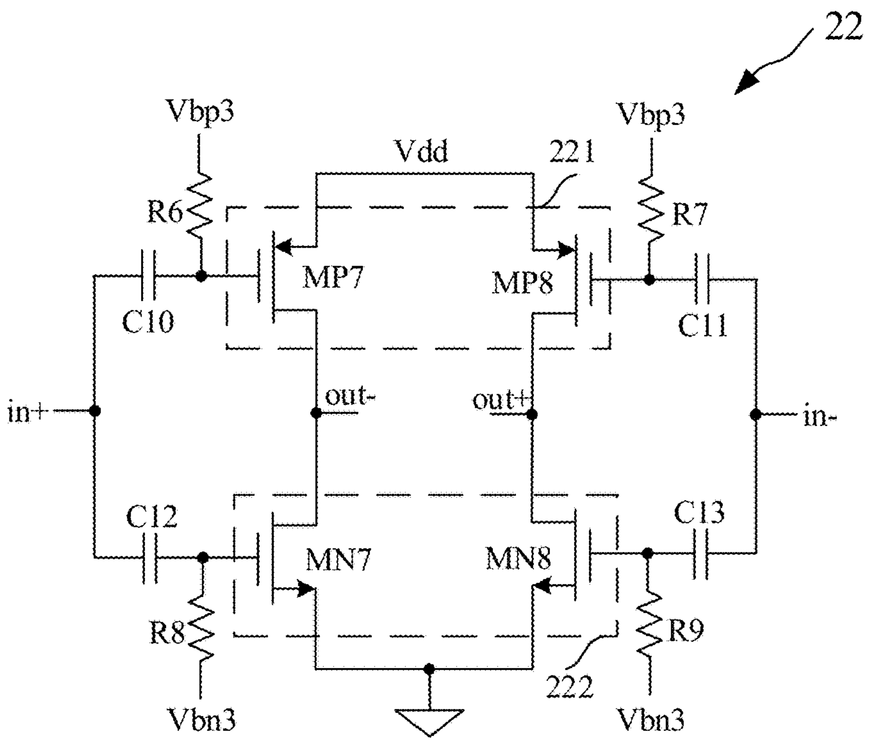
FIG. 8 shows a schematic structural diagram of a pre-amplification circuit according to one embodiment of the present disclosure.

Specifically, as an embodiment of the present disclosure, the pre-amplification circuit 22 includes a first PMOS differential amplification module 221 and a first NMOS differential amplification module 222. A source of the first PMOS differential amplification module 221 is connected to a supply voltage Vdd (the supply voltage of the pre-amplification circuit 22 can be the same or different from the supply voltage of the main amplification circuit 21, depending on actual needs); differential inputs of the first PMOS differential amplification module 221 are connected to a non-inverting input in+ and an inverting input in− of the pre-amplification circuit 22, respectively; differential outputs of the first PMOS differential amplification module 221 are connected to an inverting output out− and a non-inverting output out+ of the pre-amplification circuit 22, respectively. As shown in FIG. 8, the first PMOS differential amplification module 221 includes a seventh PMOS transistor MP7 and an eighth PMOS transistor MP8, constituting a differential pair of transistors, and gates of the seventh PMOS transistor MP7 and the eighth PMOS transistor MP8 are connected to a seventh bias voltage Vbp3 through a sixth resistor R6 and a seventh resistor R7, respectively. The first NMOS differential amplification module 222 has a grounded source, differential inputs connected to the non-inverting input in+ and the inverting input in− of the pre-amplification circuit 22, respectively, and differential outputs connected to the inverting output out− and the non-inverting output out+ of the pre-amplification circuit 22, respectively. As shown in FIG. 8, the first NMOS differential amplification module 222 includes a seventh NMOS transistor MN7 and an eighth NMOS transistor MN8, constituting a differential pair of transistors, and gates of the seventh NMOS transistor MN7 and the eighth NMOS transistor MN8 are connected to an eighth bias voltage Vbn3 through an eighth resistor R8 and a ninth resistor R9, respectively. In one example, the seventh bias voltage Vbp3 and the eighth bias voltage Vbn3 are obtained by mirroring the same bias current through a master-slave replication circuit composed of mirrored current sources. Further, in one example, the gates of the seventh PMOS transistor MP7 and the eighth PMOS transistor MP8 are connected to the corresponding inputs of the pre-amplification circuit 22 via a fifth input capacitor C10 and a sixth input capacitor C11, respectively, and the gates of the seventh NMOS transistor MN7 and the eighth NMOS transistor MN8 are further connected to the corresponding inputs of the pre-amplification circuit 22 via a seventh input capacitor C12 and an eighth input capacitor C13, respectively.

Figure 9:
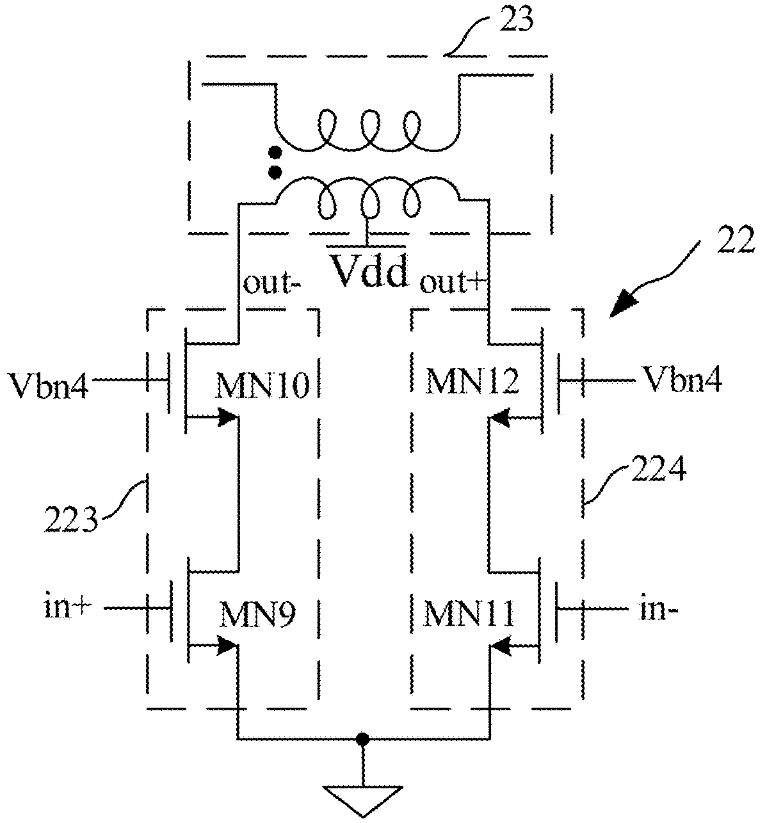
FIG. 9 shows a schematic structural diagram of a pre-amplification circuit according to one embodiment of the present disclosure.

Specifically, as another embodiment of the present disclosure, as shown in FIG. 9, the pre-amplification circuit 22 includes a first CSCG module 223 and a second CSCG module 224, an input of the first CSCG module 223 is connected to the non-inverting input in+ of the pre-amplification circuit 22 and an output of the first CSCG module 223 is connected to the inverting output out− of the pre-amplification circuit 22. An input of the second CSCG module 224 is connected to the inverting input in− of the pre-amplification circuit 22 and an output of the second CSCG module 224 is connected to the non-inverting output out+ of the pre-amplification circuit 22. As an example, the first CSCG module 223 and the second CSCG module 224 are implemented using NMOS transistors. The first CSCG module 223 includes a ninth NMOS transistor MN9 and a tenth NMOS transistor MN10. The ninth NMOS transistor MN9 is a main amplification transistor with its source grounded, its gate connected to in+, and its drain connected to a source of the tenth NMOS transistor MN10. The tenth NMOS transistor MN10 has a gate connected to a ninth bias voltage Vbn4 and a drain connected to out-. Similarly, the second CSCG module 224 includes an eleventh NMOS transistor MN11 and a twelfth NMOS transistor MN12. The eleventh NMOS transistor MN11 is a main amplification transistor with its source grounded, its gate connected to in−, and its drain connected to a source of the twelfth NMOS transistor MN12. The twelfth NMOS transistor MN12 has a gate connected to the ninth bias voltage Vbn4 and a drain connected to out+. In one example, the outputs of the pre-amplification circuit 22 are connected to the supply voltage Vdd via a coil in the first impedance matching circuit 23. As another example, the first CSCG module 223 and the second CSCG module 224 are implemented using PMOS transistors, and the circuit structure is accordingly adapted.

It should be noted that the pre-amplification circuit 22 does not require a high supply voltage, and does necessarily require a PMOS transistor being stacked over an NMOS transistor and vice versa, as shown in FIG. 8 for pre-amplification. The structure of the pre-amplification circuit of FIG. 8 can achieve better isolation between the inputs and outputs of the pre-amplification circuit 22, and has a large transconductance gain, but its output swing is small. The structure of the pre-amplification circuit of FIG. 9 is realized by using differential pairs of core MOS transistors, without a PMOS transistor and an NMOS transistor being stacked together, and has a large output swing, but its transconductance gain is relatively small. In actual implementation, the corresponding circuit structure can be selected according to actual needs, any circuit structure that can achieve pre-amplification of RF signals is applicable to the present disclosure.

As shown in FIG. 7, the first impedance matching circuit 23 is connected between the outputs of the pre-amplification circuit 22 and the inputs of the main amplification circuit 21 for achieving impedance matching between the pre-amplification circuit 22 and the main amplification circuit 21.

Specifically, in one embodiment, the first impedance matching circuit 23 is implemented using an inductive transformer, wherein two ends of a first coil of the inductive transformer are connected to the outputs of the pre-amplification circuit 22, and two ends of a second coil of the inductive transformer are connected to the inputs of the main amplification circuit 21.

As shown in FIG. 7, the main amplification circuit 21 amplifies output signals of the first impedance matching circuit 23.

Specifically, the main amplification circuit 21 adopts a structure of the main amplification circuit of Embodiment 1 or 2.

As shown in FIG. 7, the second impedance matching circuit 24 is connected to the outputs of the main amplification circuit 21 for achieving impedance matching between the main amplification circuit 21 and an output side of the amplifier 2.

Specifically, in one embodiment, the second impedance matching circuit 24 is implemented using an inductive transformer. The output side includes, but is not limited to, a load. The transformer set at the outputs of the main amplification circuit 21 in FIG. 4 is the second impedance matching circuit 24, and the transformer is included in FIG. 4 for better understanding of the operation of the main amplification circuit 21.

It should be noted that in actual implementation, any circuit structure that can achieve impedance matching is applicable to the present disclosure.

Embodiment 4

Figure 10:
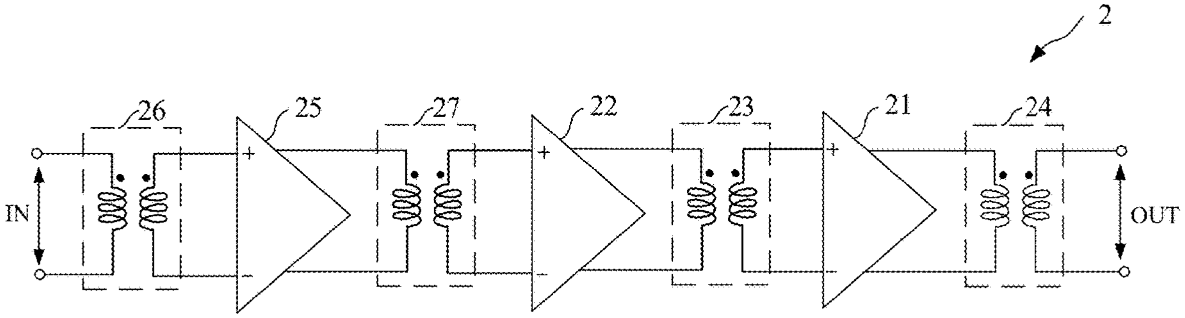
FIG. 10 shows a schematic structural diagram of an RF power amplifier according to one embodiment of the present disclosure.

As shown in FIG. 10, Embodiment 4 provides an RF power amplifier 2, which differs from Embodiment 3 in that the RF power amplifier 2 in Embodiment 4 also includes an input buffer circuit 25, a third impedance matching circuit 26, and a fourth impedance matching circuit 27 before the pre-amplification circuit 22, thereby realizing a three-stage amplification structure.

As shown in FIG. 10, the third impedance matching circuit 26 is connected between the RF input signal IN and an input of the input buffer circuit 25 for impedance matching between the input side and the input buffer circuit 25.

Specifically, in one example, the third impedance matching circuit 26 is implemented using an inductive transformer. The input side includes, but is not limited to, an inverter and/or a compensation circuit of a previous stage.

As shown in FIG. 10, the input buffer circuit 25 achieves an isolation function while providing a certain amount of gain.

Figure 11:
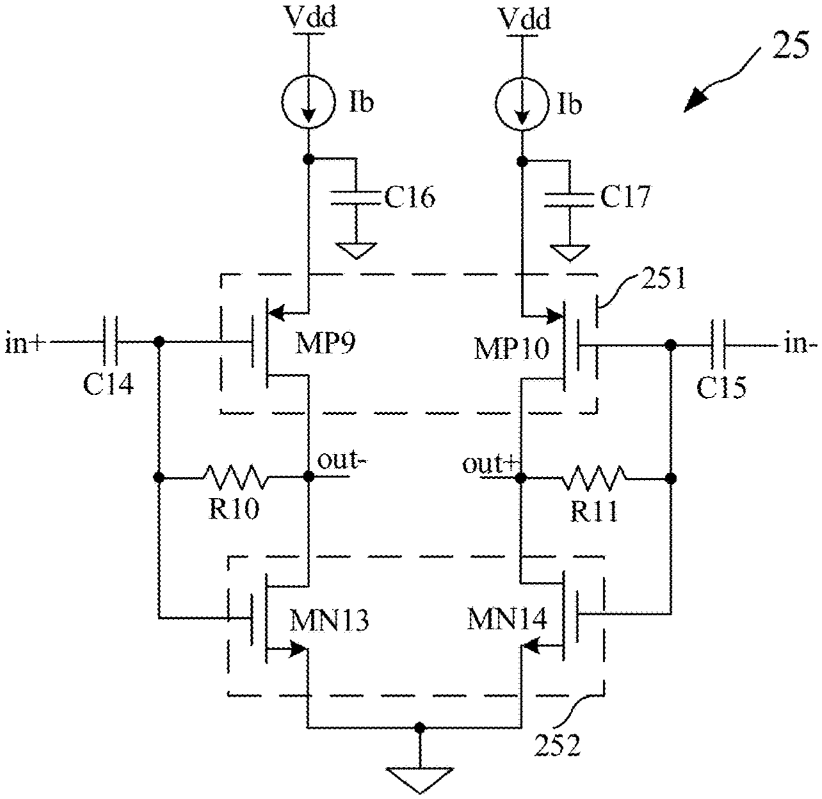
FIG. 11 shows a schematic structural diagram of an input buffer according to one embodiment of the present disclosure.

Specifically, in one example, the input buffer circuit 25 includes a current source Ib, a second PMOS differential amplification module 251, and a second NMOS differential amplification module 252. The current source Ib is connected at one end to a supply voltage Vdd (which may or may not be equal to the supply voltage of the main amplification circuit 21 and/or the pre-amplification circuit 22) and at the other end to a source of the second PMOS differential amplification module 251. As an example, one current source Ib is provided for each of the two power-to-ground paths as shown in FIG. 10 and/or FIG. 11, which in practice may share the same current source. Differential inputs of the second PMOS differential amplification module 251 are connected to a non-inverting input in+ and an inverting input in− of the input buffer circuit 25, and differential outputs of the second PMOS differential amplification module 251 are connected to an inverting output out− and a non-inverting output out+ of the input buffer circuit 25, respectively. As shown in FIG. 11, the second PMOS differential amplification module 251 includes a ninth PMOS transistor MP9 and a tenth PMOS transistor MP10, forming a differential pair of transistors. A source of the second NMOS differential amplification module 252 is grounded, differential inputs of the second NMOS differential amplification module 252 are connected to a non-inverting input in+ and an inverting input in− of the input buffer circuit 25, and differential outputs of the second NMOS differential amplification module 252 are connected to an inverting output out− and a non-inverting output out+ of the input buffer circuit 25, respectively. As shown in FIG. 11, the second NMOS differential amplification module 252 includes a thirteenth NMOS transistor MP13 and a fourteenth NMOS transistor MP14, forming a differential pair of transistors. As shown in FIG. 11, a resistor is provided between the gate and drain of each transistor in the second PMOS differential amplification module 251 and the second NMOS differential amplification module 252. The ninth PMOS transistor MP9 and the thirteenth NMOS transistor MN13 share a tenth resistor R10, one end of the tenth resistor R10 is connected to gates of the ninth PMOS transistor MP9 and the thirteenth NMOS transistor MN13, and the other end of the tenth resistor R10 is connected to the inverting output out− of the input buffer circuit 25. The tenth PMOS transistor MP10 and the fourteenth NMOS transistor MN14 share an eleventh resistor R11, one end of the eleventh resistor R11 is connected to gates of the tenth PMOS transistor MP10 and the fourteenth NMOS transistor MN14, and the other end of the eleventh resistor R11 is connected to the non-inverting output out+ of the input buffer circuit 25. A ninth input capacitor C14 is connected in series between the non-inverting input in+ of the input buffer circuit 25 and the second PMOS differential amplification module 251, and is also connected in series between the non-inverting input in+ of the input buffer circuit 25 and the second NMOS differential amplification module 252. A tenth input capacitor C15 is connected in series between the inverting input in− of the input buffer circuit 25 and the second PMOS differential amplification module 251, and is also connected in series between the inverting input in− of the input buffer circuit 25 and the second NMOS differential amplification module 252. In one embodiment, the second PMOS differential amplification module 251 is further connected with a ground capacitor at a connection node with the current source Ib. As an example, when there are two current sources, they are connected to a first ground capacitor C16 and a second ground capacitor C17 at connection nodes with the second PMOS differential amplification module 251, respectively.

It is to be noted that, in one embodiment, the input buffer circuit 25 is a transconductance buffer, wherein the current source Ib provides a constant current bias to the input buffer circuit 25 to reduce potential impact on the previous stage. The tenth resistor R10 and the eleventh resistor R11 are used to provide a DC voltage bias and to isolate the inputs from the outputs. In actual implementation, any circuit structure capable of providing isolation and buffering is applicable to the present disclosure.

As shown in FIG. 10, the fourth impedance matching circuit 27 is connected between the outputs of the input buffer circuit 25 and the inputs of the pre-amplification circuit 22 for achieving impedance matching between the input buffer circuit 25 and the pre-amplification circuit 22.

Specifically, in one example, the fourth impedance matching circuit 27 is implemented using an inductive transformer.

Otherwise, the structure and operating principle of Embodiment 4 are the same as those of Embodiment 3.

Existing wireless communication technologies invariably require RF power amplifiers with high efficiency and high linearity, especially those with a back-off output power range of about 10 dB. The power efficiency of typical existing integrated power amplifiers within the back-off output power range rarely exceeds 15%, while the RF power amplifier 2 of the present disclosure has an increased power efficiency of nearly 30%. The novel architecture of the present disclosure also compensates for transistor nonlinearity to further improve the linearity of the RF power amplifier, which improves the linearity by more than 10 dB compared to similar power amplifiers. In some embodiments of the present disclosure, a shared DC bias current is adopted, in which case transistors with a smaller size can provide gains equivalent to those of their peers, core transistors are used instead of high-voltage transistors, and no voltage VSWR protection circuit is needed; therefore, the present disclosure has a significant cost advantage.

In summary, the present disclosure provides a main amplification circuit and an RF power amplifier, and the main amplification circuit includes two PMOS amplification modules and two NMOS amplification modules; wherein each PMOS amplification module includes a common-source-common-gate (CSCG, or cascode) structure formed by a stack of K PMOS transistors, and each NMOS transistor amplification module includes a CSCG structure formed by a stack of K NMOS transistors, with K being a natural number greater than or equal to 3 and less than or equal to 5; wherein the first PMOS amplification module and the first NMOS amplification module are connected in series between a supply voltage and ground; wherein a gate of a main amplification transistor of the first PMOS amplification module and a gate of a main amplification transistor of the first NMOS amplification module are connected to a non-inverting input of the main amplification circuit, and a connection node of the first PMOS amplification module and the first NMOS amplification module is connected to an inverting output of the main amplification circuit; wherein the second PMOS amplification module and the second NMOS amplification module are connected in series between a supply voltage and ground; wherein a gate of a main amplification transistor of the second PMOS amplification module and a gate of a main amplification transistor of the second NMOS amplification module are connected to an inverting input of the main amplification circuit; wherein a connection node of the second PMOS amplification module and the second NMOS amplification module is connected to a non-inverting output of the main amplification circuit; wherein gates of the transistors in the PMOS amplification modules and the NMOS amplification modules are connected to corresponding bias voltages respectively. The main amplification circuit and RF power amplifier of the present disclosure adopts stacks of PMOS transistors and stacks of NMOS transistors to form a double push-pull amplifier architecture, using double push-pull to shorten the duration in which the non-zero voltage and non-zero current overlap (i.e., simultaneously occur) at the output of the circuit, thus effectively improving the power efficiency of the circuit. Utilizing RC filter structures and the principle of capacitive voltage dividing, the present disclosure achieves uniform distribution of a high supply voltage among three stacked core transistors. A PMOS main amplification transistor shares the same bias DC current with a NMOS main amplification transistor, which increases the power efficiency of the circuit. Parallel-connected NMOS main amplification transistor(s) and PMOS main amplification transistor(s) (which are all core transistors) make it possible to automatically compensate for nonlinear capacitance of transistors, and power efficiency is increased without introducing additional components. Nonlinear transconductance gain in the PMOS transistors and nonlinear transconductance gain in the NMOS transistors can be canceled out or partially canceled out by back-to-back connecting stacks of the PMOS transistors and stacks of the NMOS transistors, effectively improving linearity, which also ensures that the voltage at any connection node of the core transistors in the main amplification circuit will not exceed the supply voltage of the main amplification circuit in any case, and therefore there is no longer the need to introduce a VSWR voltage protection circuit, further reducing the cost. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A main amplification circuit, applied to an RF power amplifier, wherein the main amplification circuit comprises:

two PMOS amplification modules and two NMOS amplification modules, wherein each PMOS amplification module comprises a common-source-common-gate (CSCG) structure formed by a stack of K PMOS transistors, and each NMOS transistor amplification module comprises a CSCG structure formed by a stack of K NMOS transistors, with K being a natural number greater than or equal to 3 and less than or equal to 5;

wherein a first PMOS amplification module and a first NMOS amplification module are connected in series between a supply voltage and ground; wherein a gate of a main amplification transistor of the first PMOS amplification module and a gate of a main amplification transistor of the first NMOS amplification module are connected to a non-inverting input of the main amplification circuit, and a connection node of the first PMOS amplification module and the first NMOS amplification module is connected to an inverting output of the main amplification circuit;

wherein a second PMOS amplification module and a second NMOS amplification module are connected in series between the supply voltage and ground; wherein a gate of a main amplification transistor of the second PMOS amplification module and a gate of a main amplification transistor of the second NMOS amplification module are connected to an inverting input of the main amplification circuit; wherein a connection node of the second PMOS amplification module and the second NMOS amplification module is connected to a non-inverting output of the main amplification circuit;

wherein gates of the transistors in the PMOS amplification modules and the NMOS amplification modules are connected to corresponding bias voltages respectively;

wherein the bias voltages connected to main amplification transistors in the two PMOS amplification modules and the two NMOS amplification modules are generated by same bias current.

2. The main amplification circuit according to claim 1, wherein each CSCG structure comprises a last-stage transistor that is next to an output of the main amplification circuit, and each last-stage transistor has a gate connected to a corresponding RC module; wherein each RC module comprises a first resistor and a first capacitor; wherein the first resistor is connected between the gate and a drain of the corresponding last-stage transistor; wherein a first end of the first capacitor is connected to the gate of the corresponding last-stage transistor, a second end of the first capacitor is connected to the supply voltage when the first capacitor is in one of the two PMOS amplification modules, and the second end of the first capacitor is grounded when the first capacitor is in one of the two NMOS amplification modules.

3. The main amplification circuit according to claim 1, wherein each CSCG structure comprises an intermediate-stage transistor, which has a gate receiving a corresponding bias voltage and connected to a first end of a corresponding gate capacitor; wherein a second end of the gate capacitor is connected to the supply voltage when the gate capacitor is in one of the two PMOS amplification modules, and a second end of the gate capacitor is grounded when the gate capacitor is in one of the two NMOS amplification modules.

4. The main amplification circuit according to claim 1, wherein K is 3.

5. The main amplification circuit according to claim 4, wherein the supply voltage is between 3V and 5.5 V.

6. The main amplification circuit according to claim 1, wherein each CSCG structure comprises a main amplification transistor, which has a gate connected to a corresponding input of the main amplification circuit via an input capacitor.

7. An RF power amplifier, comprising:

a pre-amplification circuit, a first impedance matching circuit, a second impedance matching circuit, and the main amplification circuit as in claim 1;

wherein the pre-amplification circuit receives an RF input signal from its inputs, initially amplifies the RF input signal, and compensates for distortion due to the main amplification circuit;

wherein the first impedance matching circuit is connected between outputs of the pre-amplification circuit and inputs of the main amplification circuit for achieving impedance matching between the pre-amplification circuit and the main amplification circuit;

wherein the main amplification circuit amplifies output signals of the first impedance matching circuit;

wherein the second impedance matching circuit is connected to outputs of the main amplification circuit for achieving impedance matching between the main amplification circuit and an output side of the RF power amplifier.

8. The RF power amplifier according to claim 7, wherein the pre-amplification circuit comprises a first PMOS differential amplification module and a first NMOS differential amplification module;

a source of the first PMOS differential amplification module is connected to a supply voltage of the pre-amplification circuit, differential inputs of the first PMOS differential amplification module are connected to a non-inverting input and an inverting input of the pre-amplification circuit, respectively, and differential outputs of the first PMOS differential amplification module are connected to an inverting output and a non-inverting output of the pre-amplification circuit, respectively;

a source of the first NMOS differential amplification module is a ground, differential inputs of the first NMOS differential amplification module are connected to a non-inverting input and an inverting input of the pre-amplification circuit, respectively, and differential outputs of the first NMOS differential amplification module are connected to an inverting output and a non-inverting output of the pre-amplification circuit, respectively;

wherein gates of input-stage transistors in the first PMOS differential amplification module are connected to the same bias voltage; wherein gates of input-stage transistors in the first NMOS differential amplification module are connected to the same bias voltage.

9. The RF power amplifier according to claim 8, wherein each of the gates of the input-stage transistors in the first PMOS differential amplification module is connected to a corresponding input of the pre-amplification circuit via an input capacitor, and each of the gates of the input-stage transistors in the first NMOS differential amplification module is also connected to a corresponding input of the pre-amplification circuit via an input capacitor.

10. The RF power amplifier according to claim 7, wherein the pre-amplification circuit comprises a first common-source common-gate (CSCG) module and a second CSCG module, an input of the first CSCG module is connected to a non-inverting input of the pre-amplification circuit, and an output of the first CSCG module is connected to an inverting output of the pre-amplification circuit; wherein an input of the second CSCG module is connected to an inverting input of the pre-amplification circuit, and an output of the second CSCG module is connected to a non-inverting output of the pre-amplification circuit.

11. The RF power amplifier according to claim 7, wherein the RF power amplifier further comprises an input buffer circuit, a third impedance matching circuit, and a fourth impedance matching circuit;

wherein the third impedance matching circuit is connected between the RF input signal and an input of the input buffer circuit for impedance matching between an input side of the RF power amplifier and the input buffer circuit;

wherein the fourth impedance matching circuit is connected between outputs of the input buffer circuit and the inputs of the pre-amplification circuit for achieving impedance matching between the input buffer circuit and the pre-amplification circuit.

12. The RF power amplifier according to claim 11, wherein the input buffer circuit comprises a current source, a second PMOS differential amplification module, and a second NMOS differential amplification module;

wherein one end of the current source is connected to a supply voltage of the input buffer circuit and the other end of the current source is connected to a source of the second PMOS differential amplification module;

wherein differential inputs of the second PMOS differential amplification module are connected to a non-inverting input and an inverting input of the input buffer circuit, and differential outputs of the second PMOS differential amplification module are connected to an inverting output and a non-inverting output of the input buffer circuit, respectively;

wherein a source of the second NMOS differential amplification module is grounded, differential inputs of the second NMOS differential amplification module are connected to a non-inverting input and an inverting input of the input buffer circuit, and differential outputs of the second NMOS differential amplification module are connected to an inverting output and a non-inverting output of the input buffer circuit, respectively;

a resistor is provided between a gate and a drain of each transistor in the second PMOS differential amplification module and the second NMOS differential amplification module, each of inputs of the second PMOS differential amplification module and the second NMOS differential amplification module is connected to a corresponding differential input of the input buffer circuit through an input capacitor.

13. The RF power amplifier according to claim 12, wherein the second PMOS differential amplification module is further connected with a ground capacitor at a connection node with the current source.

14. The RF power amplifier according to claim 7, wherein each of the first impedance matching circuit and the second impedance matching circuit is an inductive transformer.

* * * * *